United States Patent [19]
Kobashi et al.

[11] Patent Number: 5,298,766
[45] Date of Patent: Mar. 29, 1994

[54] DIAMOND HETEROJUNCTION DIODE

[75] Inventors: Koji Kobashi; Kozo Nishimura; Shigeaki Miyauchi; Kazuo Kumagai; Rie Katoh, all of Kobe, Japan

[73] Assignee: Kabushiki Kaisha Kobe Seiko Sho, Kobe, Japan

[21] Appl. No.: 854,910

[22] Filed: Mar. 20, 1992

[30] Foreign Application Priority Data

Mar. 22, 1991 [JP] Japan .................... 3-058914

[51] Int. Cl.$^5$ .................. H01L 29/48; H01L 29/56
[52] U.S. Cl. ..................... 257/77; 257/12; 257/183; 257/485
[58] Field of Search .............. 257/12, 77, 497, 603, 257/604, 605, 606, 183, 485

[56] References Cited

U.S. PATENT DOCUMENTS

| | | | |
|---|---|---|---|
| 4,903,102 | 2/1990 | Yamazaki | 257/77 |
| 5,107,315 | 4/1992 | Kumagai et al. | 257/77 |
| 5,144,380 | 9/1992 | Kimoto et al. | 257/467 |

FOREIGN PATENT DOCUMENTS

| | | | |
|---|---|---|---|
| 0420188 | 4/1991 | European Pat. Off. | |
| 0445998 | 9/1991 | European Pat. Off. | 257/77 |
| 59-161882 | 9/1984 | Japan | 257/77 |
| 1-303763 | 12/1989 | Japan | 257/77 |

OTHER PUBLICATIONS

Appl. Phys. Letters, vol. 58, No. 8, Feb. 25, 1991, Ken Okano, et al., "p-n Junction Diode Made Of Semiconducting Diamond Films", pp. 840–841.

*Primary Examiner*—Rolf Hille
*Assistant Examiner*—Minhloan Tran
*Attorney, Agent, or Firm*—Oblon, Spivak, McClelland, Maier & Neustadt

[57] ABSTRACT

A diamond heterojunction diode having an improved rectifying characteristics with a small reverse current and a large forward current. Three layers are formed on a low-resistance p-type silicon substrate by the microwave plasma CVD in the order of a B-doped p type semiconducting diamond layer, an insulating undoped diamond layer (thinner than 1 μm), and an n-type semiconducting silicon layer. Ohmic electrodes are formed on the front side of a n-type semiconducting silicon layer and the back side of a substrate. Under a forward bias, the electric field is applied to the intermediate insulating layer to accelerate the transport of holes and electrons. Under a reversed bias, the energy band has a notch as well as a potential barrier due to the intermediate layer thus preventing holes from transporting from the n-type semiconducting diamond layer to the p-type semiconducting diamond layer, resulting in the improved rectifying characteristics.

1 Claim, 5 Drawing Sheets

ZERO BIAS
V = 0

P : p-TYPE DIAMOND SEMICONDUCTOR LAYER
I : DIAMOND INSULATING LAYER
N : n-TYPE SILICON SEMICONDUCTOR LAYER

FORWARD BIAS
V > 0

REVERSED BIAS
V < 0

ZERO BIAS
V = 0

P : p-TYPE DIAMOND SEMICONDUCTOR LAYER
I : SILICON DIOXIDE INSULATING LAYER
N : n-TYPE SILICON SEMICONDUCTOR LAYER

FORWARD BIAS
V > 0

REVERSED BIAS
V < 0

ZERO BIAS
V = 0

P : p-TYPE DIAMOND SEMICONDUCTOR LAYER
I : SILICON CARBIDE INSULATING LAYER
N : n-TYPE SILICON SEMICONDUCTOR LAYER

FORWARD BIAS
V > 0

REVERSED BIAS
V < 0

ZERO BIAS
V = 0

P : p-TYPE DIAMOND SEMICONDUCTOR LAYER
N : n-TYPE DIAMOND SEMICONDUCTOR LAYER

FORWARD BIAS
V > 0

REVERSED BIAS
V < 0

DIAMOND HETEROJUNCTION DIODE

BACKGROUND OF THE INVENTION

1. Field of the Invention

The present invention relates to a diamond heterojunction diode to be used for a semiconductor rectifying device.

2. Description of the Prior Art

Diamond has a high thermal conductivity, an excellent stability against heat, and a large band gap. It is electrically insulating but becomes semiconducting upon doping. Therefore, diamond is expected to be used for semiconducting devices which can function in a high electric power/high temperature region. By the advent of the synthesis of diamomd films by chemical vapor deposition (CVD), it has now become possible to grow B (boron)-doped p-type semiconducting diamond films and Si-doped or P (phosphine)-doped n-type semiconducting diamond films.

Research and development effects have been made to develop semiconductor devices employing such semiconducting diamond films, for example, a diamond p-n junction diode as a rectifying device. Such a diamond p-n junction diode has been disclosed in the literature (Iwasaki et al., Abstract of the Spring Meeting of Japan Society of Applied Physics, 30a-ZB-10, p. 388 (1990)), wherein the diamond p-n junction diode is obtained by growing a P-doped n-type semiconducting diamond layer on a B-doped p-type semiconducting diamond layer, thereby forming the p-n junction having the rectifying effect.

FIG. 6 is an energy band diagram for the conventional diamond p-n junction diode: (a) is under zero bias (bias voltage V=0); (b) is under a forward bias (V>0) where a positive voltage is applied to the p-type semiconducting diamond layer P; and (c) is under a reversed bias (V<0) where a negative voltage (the n-type semiconducting diamond layer N is positive) is applied to the p-type semiconducting diamond layer P. In this figure, $E_c$ is the energy at the lowest edge of the conduction band, $E_v$ is the energy at the highest edge of the valence band, and $E_F$ is the Fermi level.

At present, the CVD technology makes possible the synthesis of a p-type semiconducting diamond film with a resistivity as low as about $10\Omega.cm$. However, it merely permits the synthesis of a n-type semiconducting diamond film with a resistivity of the order of $10^4$–$10^6\Omega.cm$ because only a low concentration of active impurities can be contained therein. For this reason, in the conventional diamond p-n junction diode, the depletion layer becomes thick on the n-type semiconducting diamond layer side of the p-n junction. Consequently, the curvature of the energy band at the p-n junction is dull, and hence the gradient of electrical potential at the p-n junction is not sharp as shown in FIG. 6.

Therefore, under a forward bias, when holes are transported from the p-type layer into the n-type layer or electrons from the n-type layer to the p-type layer, the transport velocity is slow and the travel distance becomes longer across the p-n junction. As a result, these carriers are liable to be trapped by lattice defects and dopant atoms and disappear due to recombination therewith, thus preventing a flow of a sufficient electric current. Furthermore, there often yield amorphous layers and defects at the interface of the p-n junction, which lower the barrier height under the reversed bias, thus allowing a current to flow in the reversed direction. Therefore, such a diamond p n junction diode needs improvement in its rectifying characteristics.

SUMMARY OF THE INVENTION

It is an object of the present invention to provide a diamond heterojunction diode having good rectifying characteristics.

To achieve the object, the present invention provides a diamond heterojunction diode having a trilayer structure of a p-type semiconducting diamond layer, an intermediate insulating layer thinner than 1 $\mu$m, and a n-type semiconducting non-diamond layer.

The intermediate insulating layer is made up of at least one kind selected from the group consisting of vapor-phase deposited diamond, silicon dioxide, silicon carbide, and silicon nitride.

BRIEF DESCRIPTION OF THE DRAWINGS

The above and other objects, features and advantages of the present invention will be more apparent from the following description taken in connection with the accompanying drawings, in which:

FIGS. 3(a)–e(c) are the energy band diagrams for a diamond heterojunction diode of the present invention, wherein the intermediate insulating layer and the n-type semiconducting non-diamond layer are made up of an insulating diamond layer and n-type silicon, respectively.

DESCRIPTION OF THE PREFERRED EMBODIMENTS

Prior to the description of the preferred embodiments, the function of the diamond heterojunction diode of the present invention will be explained.

Figure 3A:
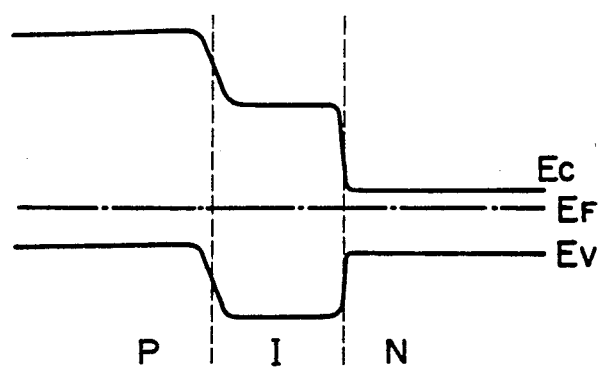
Figure 3B:
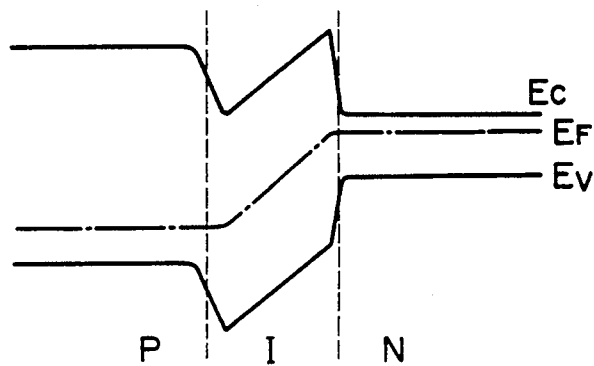
Figure 3C:
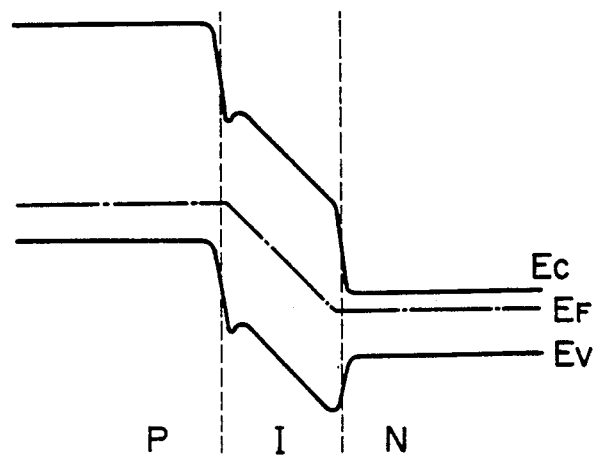
Figure 4A:
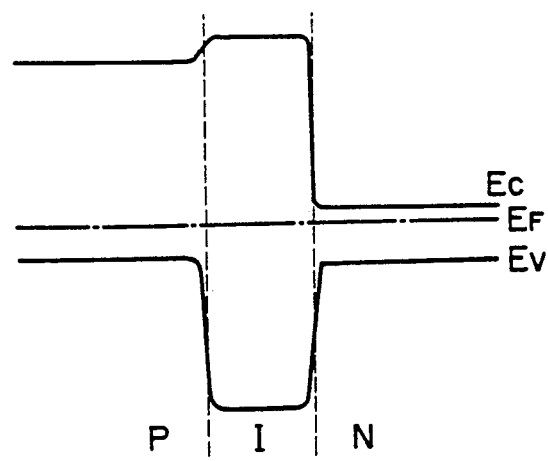
FIG. 4(a)–4(c) are the energy band diagram for a diamond heterojunction diode of the present invention, wherein the intermediate insulating layer and the n-type semiconducting non-diamond layer are made up of silicon dioxide and n-type silicon, respectively.
Figure 4B:
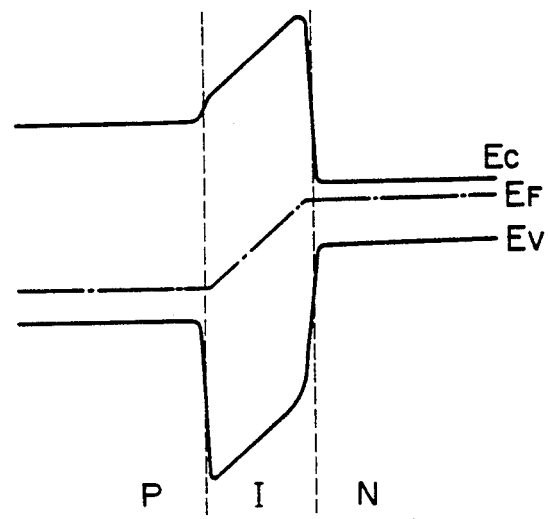
Figure 4C:
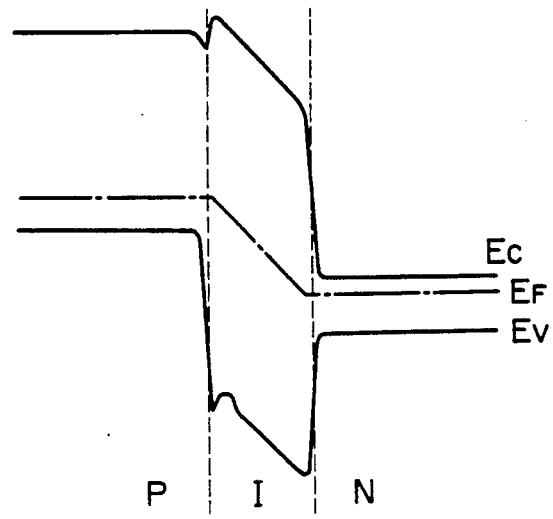
Figure 5A:
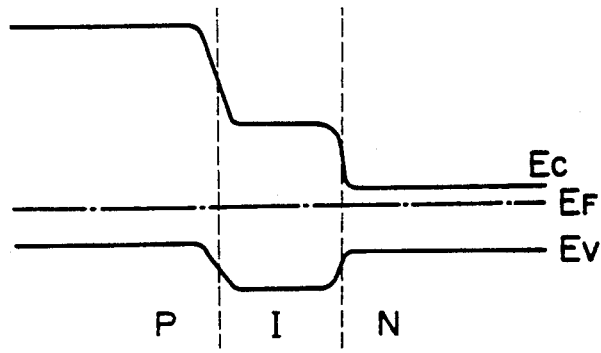
FIGS. 5(a)–5(c) are the energy band diagrams for a diamond heterojunction diode of the present invention, wherein the intermediate insulating layer and the n-type semiconducting non-diamond layer are made up of silicon carbide and n-type silicon, respectively.
Figure 5B:
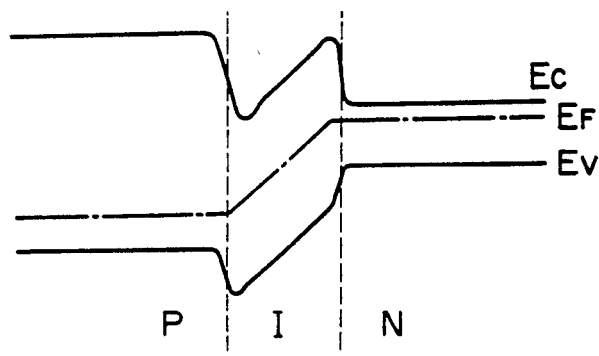
Figure 5C:
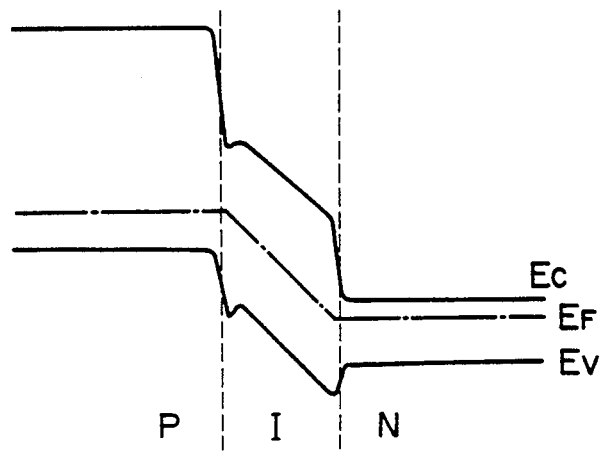
Figure 6A:
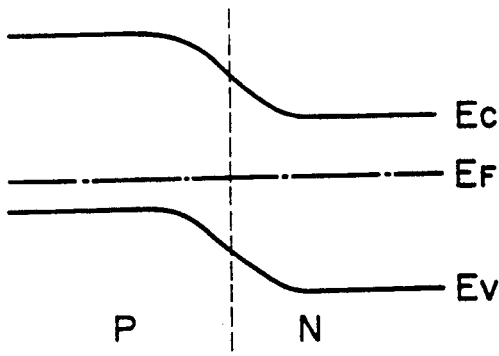
FIGS. 6(a)–6(c) are the energy band diagrams for a conventional diamond p-n junction diode.
Figure 6B:
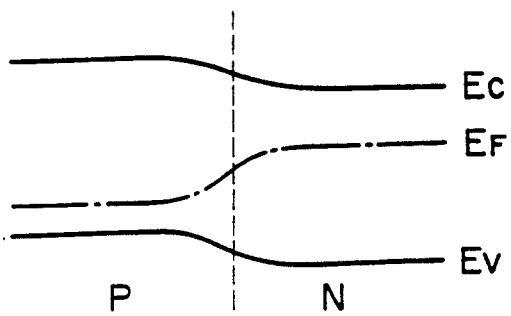
Figure 6C:
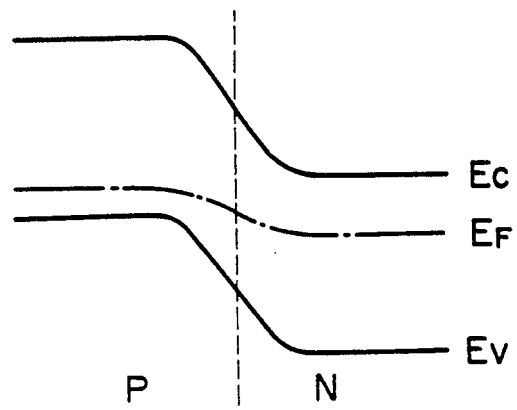

As shown in FIGS. 3 to 5, the diamond heterojunction diode of the present invention has an energy band structure quite different from that of a diamond p-n junction diode shown in FIG. 6. Assuming that respective band gaps of p-type semiconducting diamond layer P, intermediate insulating layer I, and n-type semiconducting non-diamond layer N are expressed by $E_g(P)$, $E_g(I)$ and $E_g(N)$, the energy band structures would be classified into the following three categories according to the magnitudes of the band gaps. In the above figures, (a) shows the energy band structure under zero bias (bias voltage V=0); (b) is under a forward bias (V>0) where a positive voltage is applied to the p type semiconducting diamond layer P; and (c) is under a reversed bias (V<0) where a negative voltage (the n-type semiconducting diamond layer P is positive) is applied to the p-type semiconducting diamond layer P. In these figures, $E_c$ is the energy at the lowest edge of the conduction band, $E_v$ is the energy at the highest edge of the valence band, and $E_F$ is the Fermi level.

$$E_g(P) = E_g(I) > E_g(N) \quad (1)$$

This corresponds to the diamond heterojunction diode having a tri-layer structure of a p-type semiconducting diamond layer P, an intermediate insulating diamond layer I, and an n-type semiconducting silicon layer N having a smaller band gap than diamond. The energy band diagram in this case is shown in FIG. 3.

$$E_g(I) > E_g(P) > E_g(N) \quad (2)$$

This corresponds to the diamond heterojunction diode having a tri layer structure of a p-type semiconducting diamond layer P, an intermediate insulating silicon dioxide layer I, and an n-type semiconducting silicon layer N having a smaller band gap than diamond. The energy band diagram in this case is shown in FIG. 4.

$$E_g(P) > E_g(I) > E_g(N) \quad (3)$$

This corresponds to the diamond heterojunction diode having the tri-layer structure of a p-type semiconducting diamond layer P, an intermediate insulating silicon carbide layer I, and an n-type semiconducting silicon layer N having a smaller band gap than diamond. The energy band diagram in this case is shown in FIG. 5.

As mentioned above, since the diamond heterojunction diode of the present invention has an intermediate insulating layer I between a p-type semiconducting diamond layer P and an n-type semiconducting non-diamond layer N, the electric field due to the outside electric power supply is almost applied to the intermediate insulating layer I. Under a reversed bias, the p-type diamond layer P accumulates negative charges and the n-type non-diamond layer N accumulates positive charges, resulting in the energy band structure having a notch as shown in FIGS. 3(c), 4(c), and 5(c). The notch as well as the barrier due to the intermediate layer prevent holes from transporting from the n-type semiconducting non-diamond layer N to the p-type semiconducting diamond layer P. Electrons have a negligible effect because they are minority carriers in the p-type semiconducting diamond layer P. Consequently, in the diamond heterojunction diode, the reverse current is much smaller than in the diamond p-n junction diode.

Furthermore, since the diamond heterojunction diode has a n-type semiconducting material with a low electrical resistance, the heterojunction has a shorter depletion layer as compared with the diamond p-n junction diode. Consequently, when carriers such as electrons and holes are transported across the heterojunction, these carriers are less liable to disappear by recombination. Under a forward bias, the strong electric field applied to the intermediate insulating layer I accelerates the transport of electrons and holes, resulting in a large forward current than in the diamond p-n junction diode.

According to the present invention, the insulating layer should preferably be made of one kind selected from the group consisting of vapor-phase deposited diamond, silicon dioxide, silicon carbide, and silicon nitride ($Si_3N_4$). These materials are a covalent crystal like the diamond film constituting the p-type semiconducting layer and like silicon which is the typical material constituting the n-type semiconducting non-diamond layer. Therefore, these materials have less defects at the heterojunction interface between the semiconducting diamond layer and the semiconducting silicon layer than other insulating materials The intermediate insulating layer should be thinner than 1 μm. If it is thicker than 1 μm, the device has a large electrical resistance, resulting in poor rectifying characteristics.

EXAMPLES

The present invention will be described in detail with reference to the following examples.

EXAMPLE 1

Figure 1:
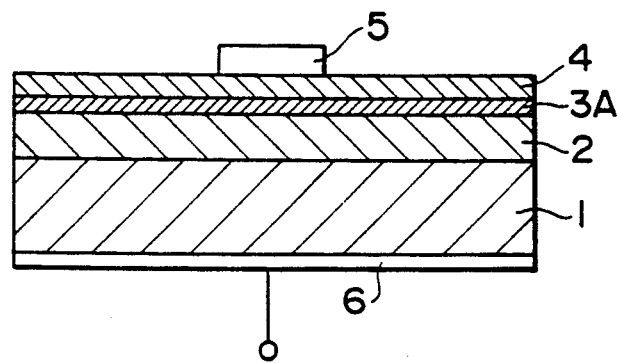
FIG. 1 is a schematic cross-sectional view showing a diamond heterojunction diode according to an embodiment of the present invention.

A diamond heterojunction diode, as shown in FIG. 1, was fabricated in the following procedure: A low-resistance p-type silicon substrate 1 (resistivity: less than 0.01 Ω.cm, size: 20 mm × 10 mm) was polished for about 1 hour by diamond paste having an average particle diameter of 0.25 μm. The three layers were formed on the p-type silicon substrate by microwave plasma CVD in the order of a B-doped polycrystalline p-type semiconducting diamond layer 2 (5 μm thick), an undoped polycrystalline insulating diamond layer 3A (0.5 μm thick), and a polycrystalline n-type semiconducting silicon layer 4 (1 μm thick).

Used in the synthesis of the p-type semiconducting diamond layer 2, was a source gas of a $CH_4$-$H_2$ mixture ($CH_4$ concentration: 0.5%) with a doping gas of diborane ($B_2H_6$) (diluted by $H_2$) in the concentration of 0.1 ppm added to the whole gas flow rate of 100 cc/min. Used in the synthesis of the insulating diamond layer 3A, was a source gas of a $CH_4$-$H_2$ mixture ($CH_4$ concentration: 0.5%) with oxygen in the concentration of 0.1% to the whole gas flow rate of 100 cc/min.

An electrode 5 of an Au film having a diameter of about 100 μm was formed on the n-type semiconducting silicon layer 4 by photolithography. The back side of the p-type silicon substrate 1 was bonded to an ohmic electrode 6 of a copper plate by a silver paste. For comparison, a hetero p-n junction diode was prepared in the same manner as mentioned above without the insulating diamond layer 3A.

Figure 2:
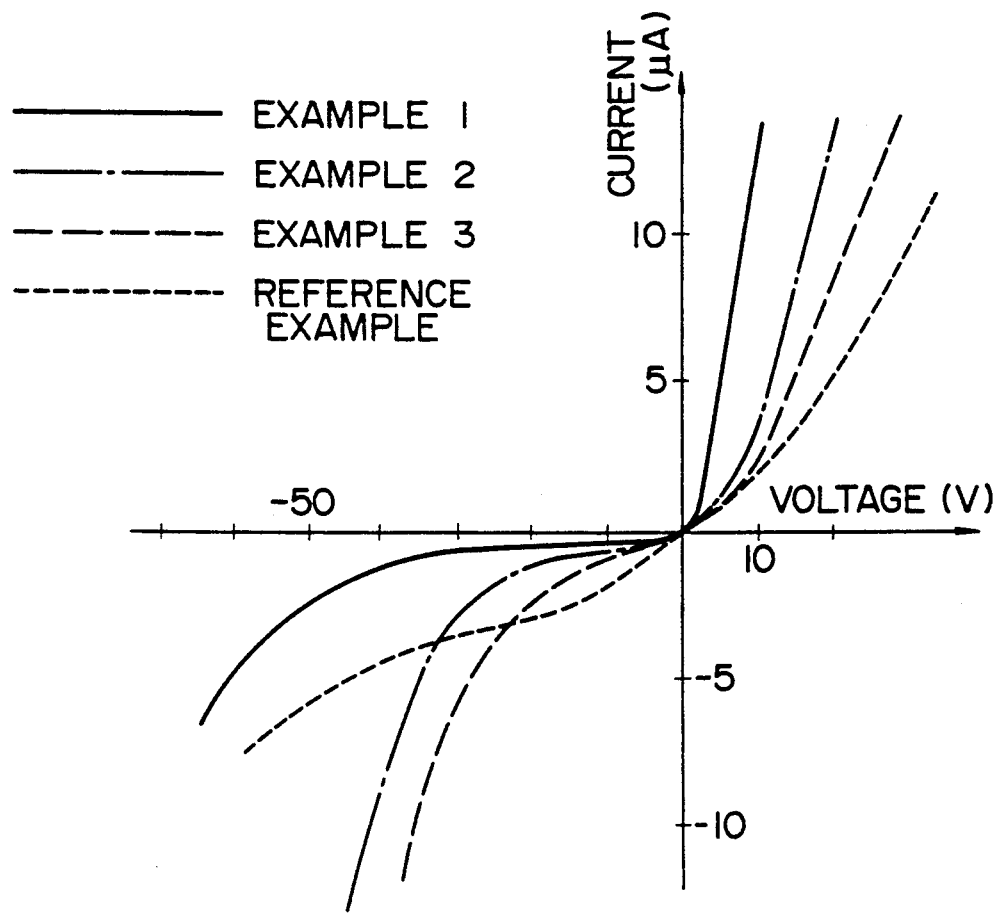
FIG. 2 is a graph showing the current-voltage characteristics of a diamond heterojunction diode according to the present invention.

The diodes thus fabricated were tested for the current-voltage characteristics (I-V curve) using a prober. The results are shown in FIG. 2. It was found that the diamond heterojunction diode in this example has greatly improved rectifying characteristics, as indicated by a small reverse current and a large forward current, over the reference hetero p-n junction diode without the intermediate insulating layer.

EXAMPLE 2

A diamond heterojunction diode was prepared in the following procedure: It has the same tri-layer structure as that in Example 1, except that the diamond insulating layer 3A is replaced by an insulating silicon dioxide layer.

The three layers were formed on a low-resistance p-type silicon substrate 1 by the microwave plasma CVD in the order of a B-doped polycrystalline p-type semiconducting diamond layer 2 (5 μm thick), an insulating silicon dioxide layer 3B (20Å thick), and a polycrystalline n-type semiconducting silicon layer 4 (1 μm thick). As in Example 1, an Au electrode 5 with about 100 μm in diameter was formed on the n-type silicon layer 4 and an ohmic electrode 6 of a copper plate bonded to the back side of the p-type silicon substrate 1 by a silver paste.

The diode thus fabricated was tested for the current-voltage characteristics (I-V curve) using a prober. The results are also shown in FIG. 2. It was found that the diamond heterojunction diode in this example has greatly improved rectifying characteristics, as indicated by a small reverse current and a large forward current, over the reference hetero PN junction diode.

EXAMPLE 3

A diamond heterojunction diode was prepared in the following procedure: It has the same tri-layer structure as that in Example 1, except that the diamond insulating layer 3A is replaced by an insulating silicon carbide layer.

The three layers were formed on a low-resistance p-type silicon substrate 1 by the microwave plasma CVD in the order of a B-doped p-type polycrystalline semiconducting diamond layer 2 (5 μm thick), a silicon carbide insulating layer 3C (20A thick), and a n type polycrystalline semiconducting silicon layer 4 (1 μm thick). As in Example 1, an Au electrode 5 with 100 μm in diameter was formed on the n-type silicon layer 4 and an ohmic electrode 6 of a copper plate was bonded to the back side of the p-type silicon substrate 1 by Ag paste.

The diode thus fabricated was tested for the current-voltage characteristics using a prober. The results are shown in FIG. 2. It was found that the diamond heterojunction diode in this example has greatly improved rectifying characteristics, as indicated by a small reverse current and a large forward current, over the reference hetero PN junction diode.

It was also found that the diamond heterojunction diode having an intermediate insulating silicon nitride ($Si_3N_4$) layer also exhibits good rectifying characteristics. The aforesaid heterojunction having a tri-layer structure can be applied to a multi-layer structure of a p-type semiconducting diamond layer P and a n-type semiconducting non-diamond layer N, for example, PNP and NPN semiconductor devices such as transistors, and PNPN and NPNP semiconductor devices such as bistable diodes.

As mentioned above, the present invention provides a diamond heterojunction diode has a tri-layer structure of a p-type semiconducting diamond layer, an intermediate insulating layer of specific thickness, and an n-type semiconducting non-diamond layer. Under a forward bias, the electric field applied to the insulating layer accelerates the transport of holes and electrons. Under a reversed bias, the notch as well as the barrier due to the intermediate layer prevent holes from transporting from the n-type semiconducting non-diamond layer to the p-type semiconducting diamond layer. For these reasons, the diamond heterojunction diode exhibits good rectifying characteristics with a small reverse current and a large forward current.

What is claimed is:

1. A diamond heterojunction diode having a tri-layer structure of a p-type semiconducting diamond layer, an intermediate insulating layer thinner than 1 μm, and an n-type semiconducting non-diamond layer, wherein said intermediate insulating layer is made up of at least one material selected from the group consisting of vapor-phase deposited diamond, silicon dioxide, silicon carbide, and silicon nitride.

* * * * *